United States Patent
Osawa et al.

(10) Patent No.: US 6,912,159 B2
(45) Date of Patent: Jun. 28, 2005

(54) BOOSTING CIRCUIT AND NON-VOLATILE SEMICONDUCTOR STORAGE DEVICE CONTAINING THE SAME

(75) Inventors: Kouichi Osawa, Takatsuki (JP); Seiji Yamahira, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/678,932

(22) Filed: Oct. 3, 2003

(65) Prior Publication Data

US 2004/0095806 A1 May 20, 2004

(30) Foreign Application Priority Data

Nov. 19, 2002 (JP) ........................................ 2002-335742

(51) Int. Cl.[7] .............................................. G11C 16/04
(52) U.S. Cl. ............................ 365/185.18; 365/189.09; 365/189.11
(58) Field of Search ....................... 365/185.18, 189.09, 365/189.11, 233

(56) References Cited

U.S. PATENT DOCUMENTS 5,969,988 A 10/1999 Tanzawa et al.
6,034,899 A * 3/2000 Iwahashi ................ 365/189.11
6,366,519 B1 4/2002 Hung et al.

FOREIGN PATENT DOCUMENTS

JP 7-111095 4/1995

* cited by examiner

*Primary Examiner*—David Lam
(74) *Attorney, Agent, or Firm*—Merchant & Gould P.C.

(57) ABSTRACT

A boosting circuit in which a boosting efficiency is enhanced without increasing a chip area, and a time required for reaching a desired boosting voltage different in a voltage level and current ability is shortened. A stage-number switching circuit (20), for switching a connection state between charge pump circuits (12, 13), enables clock signals (CLK1, CLK3) to be supplied to the charge pump circuit (11) among 4-phase clock signals (CLK1 to CLK4) to be supplied to 2-stage charge pump circuits in the case where a stage-number switching control signal (SWHON) is at a supply voltage VDD level, is synchronized with pumping of the charge pump circuits, and turns on an internal switching transistor at a potential higher than a boosting potential of the charge pump circuit (12) in the previous stage, whereby between the 2-stage charge pump circuits (11, 12; 13, 14), a series connection is obtained.

36 Claims, 10 Drawing Sheets

BOOSTING CIRCUIT AND NON-VOLATILE SEMICONDUCTOR STORAGE DEVICE CONTAINING THE SAME

BACKGROUND OF THE INVENTION

1. Field of the Invention

The present invention relates to a boosting circuit for generating positive/negative high voltages that differ in voltage level in accordance with an operation mode, contained in a non-volatile semiconductor storage device.

2. Description of the Related Art

In a non-volatile semiconductor storage device such as a flash EEPROM (electrically erasable programmable read-only memory), it is required that a positive high voltage higher than a supply voltage and a negative high voltage lower than a ground potential, which are different in voltage level and current ability, are applied to a memory cell array transistor in accordance with read, erasure, and write modes. Recently, due to the demand for the miniaturization of a system, the decrease in a supply voltage, the power consumption, and the like, it is desired that a boosting circuit for generating a high voltage be contained in a non-volatile semiconductor storage device, and a boosting efficiency of the boosting circuit is enhanced.

Furthermore, in order to generate positive/negative high voltages that are different in voltage level and current ability in one boosting circuit, plural-stage charge pump circuits connected in series with each other are provided, and the number of the stages is switched.

FIG. 9 is a circuit diagram showing an exemplary configuration of a negative boosting circuit for generating negative high voltages different in voltage level as a conventional boosting circuit. In FIG. 9, reference numerals 11, 12, 13, and 14 denote charge pump circuits (PUMP1, PUMP2, PUMP3, PUMP4) of a threshold canceling type. Assuming that the high level of clock signals CLK3 and CLK2 is a supply voltage VDD, and the low level thereof is a ground potential VSS (=0 V), each charge pump circuit boosts an input voltage to a negative side by −VDD and outputs it. Other clock signals CLK1 and CLK4 have the same amplitude as that of the clock signals CLK3 and CLK2. The input voltage to the charge pump circuit 11 is 0 V, so that the output voltage thereof is −VDD, and the output voltage of the charge pump circuit 12 that receives the voltage −VDD is −2VDD. Thus, negative high voltages in a range of 0 V to −2VDD are generated by the 2-stage charge pump circuits 11 and 12. Furthermore, an input voltage is boosted to a negative side by −2VDD by the 2-stage charge pump circuits 13 and 14. The detail of the charge pump circuits 11 to 14 of a threshold canceling type will be described later.

Reference numeral 60 denotes a stage-number switching circuit for switching the number of stages of charge pump circuits. In the case where a stage-number switching control signal SWHON to be input to the stage-number switching circuit 60 is at a logic low level (i.e., the stage-number switching circuit 60 is deactivated), a level shift circuit LS1 turns off an N-channel MOS transistor Tn1 and turns on an N-channel MOS transistor Tn2. Because of this, the 2-stage charge pump circuits 11 and 12 and the 2-stage charge pump circuits 13 and 14 are connected in parallel with each other. As a result, the output voltage −2VDD of the 2-stage charge pump circuits 11 and 12 causes a first negative voltage VNN1 (=−2VDD) to be output as a negative voltage VNN through a P-channel MOS transistor Tp1 connected as a diode for preventing a reverse flow. Furthermore, the output voltage −VDD of the 2-stage charge pump circuits 13 and 14 causes a first negative voltage VNN1 (=−2VDD) to be output as a negative voltage VNN through a P-channel MOS transistor Tp2 connected as a diode for preventing a reverse flow (Route (1)).

On the other hand, in the case where the stage-number switching control signal SWHON is at a logic high level i.e., the stage-number switching circuit 60 is activated), the level shift circuit LS1 turns on an N-channel MOS transistor Tn1, and turns off an N-channel MOS transistor Tn2. Because of this, the 2-stage charge-pump circuits 11 and 12 and the 2-stage charge-pump circuits 13 and 14 are connected in series with each other. As a result, the output voltage −2VDD of the 2-stage charge pump circuits 11 and 12 is supplied to the charge pump circuit 13 through a P-channel MOS transistor Tp3 connected as a diode for rectifying a voltage and an N-channel MOS transistor Tn1, and boosted to −4VDD by the 2-stage charge pump circuits 13 and 14. As a result, the input voltage −4DD causes a second negative voltage VNN2 (=−4VDD) to be output as a negative voltage VNN through a P-channel MOS transistor Tp2 connected as a diode for preventing a reverse flow (Route (2)). In this case, the P-channel MOS transistor Tp1 connected as a diode for preventing a reverse flow is in a reverse bias state to be turned off.

Thus, the stage-number switching circuit 60 generates two negative high voltages different in voltage level in the same negative boosting circuit. Cp1 denotes a smoothing capacitor for an output.

Conventionally, in order to suppress a supply voltage VEE of the level shift circuit LS1 from being fluctuated due to a pumping operation in the stage-number switching circuit 60, the P-channel MOS transistor Tp3 connected as a diode for rectifying a supply voltage and a smoothing capacitor Cp2 are provided.

Next, the configuration and operation of the 2-stage charge pump circuits 11 and 12 shown in FIG. 9 will be described with reference to FIGS. 10 and 11.

FIG. 10 shows a circuit diagram showing an internal configuration of the 2-stage charge pump circuits 11 and 12, and FIG. 11 is a timing chart of four clock signals CLK1, CLK2, CLK3, and CLK4 supplied to the 2-stage charge pump circuits 11 and 12.

In FIG. 10, P-channel MOS transistors (hereinafter, referred to as "charge transfer transistors") Tp5 and Tp7 are connected between the ground potential and the output VOUT so that current channels thereof are connected in series with each other. One electrode of a capacitor Cp4 is connected to a connection node N5 of the charge transfer transistor Tp5 and one electrode of a capacitor Cp6 is connected to an output node N7 of the charge transfer transistor Tp7. The other electrode of the capacitor Cp4 is supplied with the clock signal CLK3 having an amplitude of a supply voltage VDD, and the other electrode of the capacitor Cp6 is supplied with the clock signal CLK2 having an amplitude of the supply voltage VDD. One electrode of the capacitor Cp3 is connected to a gate of the charge transfer transistor Tp5, and one electrode of the capacitor Cp5 is connected to a gate of the charge transfer transistor Tp7. The other electrode of the capacitor Cp3 is supplied with the clock signal CLK1 having an amplitude of the supply voltage VDD, and the other electrode of the capacitor Cp5 is supplied with a clock signal CLK4 having an amplitude of the supply voltage VDD.

Furthermore, the current channels of the threshold canceling P-channel MOS transistors (hereinafter, referred to as "threshold canceling transistors") Tp4 and Tp6 are connected between the gate and the drain of the charge transfer transistors Tp5 and Tp7, respectively. Each gate of the threshold canceling transistors Tp4 and Tp6 is connected to each source (nodes N5 and N7) of the charge transfer transistors Tp5 and Tp7. The threshold canceling transistors Tp4 and Tp6 are provided so as to cancel (compensate for) threshold voltages of the charge transfer transistors Tp5 and Tp7 that are operated as diodes.

Next, the boosting operation of the 2-stage charge pump circuits 11 and 12 thus configured will be described with reference to a timing chart in FIG. 11.

First, at a time t1 in FIG. 11, the clock signal CLK4 rises from 0 V to VDD. As a result, the voltage level of the node N6 is increased due to the coupling with the capacitor Cp5. Furthermore, the charge transfer transistor Tp7 is turned off, and the node N7 is put in a floating state.

Next, at a time t2, the clock signal CLK2 falls from VDD to 0 V As a result, the voltage level V7 of the node N7 is decreased due to the coupling with the capacitor Cp6. The threshold canceling transistor Tp6 is turned on, and the voltage level of the node N5 becomes the same as that of the node N6.

Next, at a time t3, the clock signal CLK3 rises from 0 V to VDD. As a result, the voltage level V5 of the node N5 is increased due to the coupling with the capacitor Cp4. Furthermore, the threshold canceling transistor Tp4 is turned off, and the node N4 is put in a floating state.

Next, at a time t4, the clock signal CLK1 falls from VDD to 0 V As a result, the voltage level of the node N4 is decreased due to the coupling with the capacitor Cp3. Furthermore, the charge transfer transistor Tp5 is turned on, and a current flows from the node N5 to a ground potential, whereby the voltage level V5 of the node N5 is decreased.

Next, at a time t5, the clock signal CLK1 rises from 0 V to VDD. As a result, the voltage level of the node N4 is increased due to the coupling with the capacitor Cp3. Furthermore, the charge transfer transistor Tp5 is turned on, and the node N5 is put in a floating state.

Next, at a time t6, the clock signal CLK3 falls from VDD to 0 V As a result, the voltage level V5 of the node N5 decreases due to the coupling with the capacitor Cp4. Furthermore, the threshold canceling transistor Tp4 is turned on, and the node N4 reaches a ground potential (0 V).

Then, at a time t7, the clock signal CLK2 rises from 0 V to VDD. Because of this, the voltage level V7 of the node N7 is increased (V5<V7) due to the coupling with the capacitor Cp6. Furthermore, the threshold canceling transistor Tp6 is turned off, and the node N6 is put in a floating state.

Next, at a time t8, the clock signal CLK4 falls from VDD to 0 V As a result, the voltage level of the node N6 is decreased due to the coupling with the capacitor Cp5. Furthermore, the charge transfer transistor Tp7 is turned on, and a current flows from the node N7 to the node N5 because of the relationship V5<V7 at the time t7, whereby the voltage level V7 of the node N7 is decreased.

Finally, a current flows to a ground potential through the charge transfer transistor Tp5, whereby the voltage level of the node N5 is decreased to −VDD. Furthermore, a current flows to the node N5 through the charge transfer transistor Tp7, whereby the voltage level of the node N7 is decreased to −2VDD. As a result, a negative high voltage of −2VDD is generated as an output voltage VOUT.

The principle by which a negative high voltage −2VDD is obtained from the 2-stage charge pump circuits 11 and 12 is as described above.

Conventionally, as shown in FIG. 9, in order to suppress the supply voltage VEE of the level shift circuit LS1 from being fluctuated due to a pumping operation, the P-channel MOS transistor Tp3 connected as a diode for rectifying the supply voltage VEE and the smoothing capacitor Cp2 are provided in the stage-number switching circuit 60.

Therefore, in the case where a second negative voltage VNN2 is generated in the Route (2) in which the 2-stage charge pump circuits 11 and 12 are connected in series with the 2-stage charge pump circuits 13 and 14, the boosting current ability in an output terminal is decreased by a threshold voltage Vth of the P-channel MOS transistor Tp3 connected as a diode in the stage-number switching circuit 60, and a boosting efficiency is decreased. In order to suppress the decrease in a boosting efficiency, it is required that the size of the P-channel MOS transistor Tp3 is increased, and the threshold voltage Vth is decreased. Because of this, a chip area is increased.

Furthermore, by using the smoothing capacitor Cp2, the time required for reaching the second negative voltage VNN2 is prolonged due to a time constant composed of an ON-resistance of the P-channel MOS transistor Tp3 and the capacitance of the smoothing capacitor Cp2.

SUMMARY OF THE INVENTION

Therefore, with the foregoing in mind, it is an object of the present invention to provide a boosting circuit in which a boosting efficiency is enhanced without increasing a chip area and the time required for reaching a desired boosting voltage having different voltage level and current ability is shortened, and a non-volatile semiconductor storage device containing the boosting circuit.

In order to achieve the above-mentioned object, a first boosting circuit of the present invention having charge pump circuits for generating a boosting voltage with respect to a predetermined potential by allowing charge to move through a charge transfer transistor in synchronization with a clock signal input through a capacitor, includes: a first charge pump circuit group (PUMP1, PUMP2) in which the charge pump circuits are connected in series of n stages (n is an integer of 2 or more) to each other; a second charge pump circuit group (PUMP3, PUMP4) in which the charge pump circuits are connected in series of m stages (m is an integer of 2 or more) to each other; and a stage-number switching circuit (SW circuit) for switching an output terminal of the first charge pump circuit group and an input terminal of the second charge pump circuit group between a connected state and an unconnected state in accordance with a stage-number switching control signal (SWHON), in such a manner that the first charge pump circuit group and the second charge pump circuit group are connected in series with each other and the second charge pump circuit group outputs a first boosting voltage, or the first charge pump circuit group and the second charge pump circuit group are connected in parallel with each other and the first and second charge pump circuit groups output a second boosting voltage. The stage-number switching circuit includes: a switching transistor having a current channel connected between the output terminal of the first charge pump circuit group and the input terminal of the second charge pump circuit group; and a capacitor, one electrode of which is supplied with a clock signal synchronized with a clock signal input to the charge pump circuit and the other electrode of which is connected to a gate of the switching transistor. In a case where the stage-number switching control signal is at a first voltage level (supply voltage VDD), the switching transistor is turned on with a supplied clock signal, and in a case where the stage-number switching control signal is at a second voltage level (ground potential 0 V), the switching transistor is turned off.

In order to achieve the above-mentioned object, a second boosting circuit having charge pump circuits for generating a boosting voltage with respect to a predetermined potential by allowing charge to move through a charge transfer transistor in synchronization with a clock signal input through a capacitor, includes: a first charge pump circuit group (PUMP1, PUMP2) in which the charge pump circuits are connected in series of n stages (n is an integer of 2 or more) to each other; a second charge pump circuit group (PUMP3, PUMP4) in which the charge pump circuits are connected in series of m stages (m is an integer of 2 or more) to each other; a third charge pump circuit group (PUMP5, PUMP6) connected in series with the second charge pump circuit group, in which the charge pump circuits are connected in series of p stages (p is an integer of 2 or more) to each other, and which outputs a first or second boosting voltage; a first stage-number switching circuit for switching an output terminal of the first charge pump circuit group and an input terminal of the second charge pump circuit group between a connected state and an unconnected state in accordance with a first stage-number switching control signal (SWHON); a gate circuit (AND circuit) for enabling or disabling a clock signal supplied to the second charge pump circuit group in accordance with the first stage-number switching control signal; and a second stage-number switching circuit for switching the output terminal of the first charge pump circuit group and an input terminal of the third charge pump circuit group between a connected state and an unconnected state, in accordance with a second stage-number switching control signal (/SWHON) that is a logic inverse signal of the first stage-number switching control signal. The first stage-number switching circuit includes: a first switching transistor having a current channel connected between the output terminal of the first charge pump circuit group and the input terminal of the second charge pump circuit group; and a first capacitor, one electrode of which is supplied with a clock signal synchronized with a clock signal input to the charge pump circuit, and the other electrode of which is connected to a gate of the first switching transistor. In a case where the first stage-number switching control signal is at a first voltage level (supply voltage VDD), the first switching transistor is turned on with a supplied clock signal, and in a case where the first stage-number switching control signal is at a second voltage level (ground potential 0 V), the first switching transistor is turned off. The second stage-number switching circuit includes: a second switching transistor having a current channel connected between the output terminal of the first charge pump circuit group and the input terminal of the third charge pump circuit group; and a second capacitor, one electrode of which is supplied with a clock signal synchronized with a clock signal input to the charge pump circuit, and the other electrode of which is connected to a gate of the second switching transistor. In a case where the second stage-number switching control signal is at the first voltage level, the second switching transistor is turned on with a supplied clock signal, and in a case where the second stage-number switching control signal is at the second voltage level, the second switching transistor is turned off.

According to the above-mentioned configurations of the first and second boosting circuits, by using 4-phase clock signals for charge pump circuits in a stage-number switching circuit, transistors having a reduced size equal to that of transistors for charge pump circuits can be used. Therefore, the total area of the transistors is kept the same or reduced even though the number of the transistors is increased. Furthermore, a switching transistor is turned on or off in synchronization with 4-phase clock signals for charge pump circuits. Therefore, only the potential that is high in terms of an absolute value in a charge pump circuit in a previous stage can be transmitted to a charge pump circuit in a subsequent stage while preventing a reverse flow, and the charge of the charge pump circuit in the previous stage can be transmitted efficiently to the charge pump circuit in the subsequent stage.

In order to achieve the above-mentioned object, a third boosting circuit of the present invention having charge pump circuits for generating a boosting voltage with respect to a predetermined potential by allowing charge to move through a charge transfer transistor in synchronization with a clock signal input through a capacitor, includes: a first charge pump circuit group (PUMP1, PUMP2) in which the charge pump circuits are connected in series of n stages (n is an integer of 2 or more) to each other; a second charge pump circuit group (PUMP3, PUMP4) in which the charge pump circuits are connected in series of m stages (m is an integer of 2 or more) to each other; and a stage-number switching circuit (SW circuit) for switching an output terminal of the first charge pump circuit group and an input terminal of the second charge pump circuit group between a connected state and an unconnected state in accordance with a stage-number switching control signal (SWHON), in such a manner that the first charge pump circuit group and the second charge pump circuit group are connected in series with each other and the second charge pump circuit group outputs a first boosting voltage, or the first charge pump circuit group and the second charge pump circuit group are connected in parallel with each other and the first and second charge pump circuit groups output a second boosting voltage. The stage-number switching circuit includes: a level shift circuit that is supplied with the first or second boosting voltage as a supply voltage to shift a voltage level of the stage-number switching control signal; and a switch circuit for switching an output terminal of the first charge pump circuit group and an input terminal of the second charge pump circuit group between a connected state and an unconnected state, in accordance with a signal output from the level shift circuit.

The switch circuit sets a potential of the input terminal of the second charge pump circuit group to be the same as a potential of the input terminal of the first charge pump circuit group, with a signal output from the level shift circuit, in a case where the stage-number switching control signal is at the second voltage level.

According to the above-mentioned configuration of the third boosting circuit, by using, as a supply voltage of the level shift circuit, a boosting voltage of the output terminal of the boosting circuit, which is higher in terms of an absolute value than the potentials of the input terminal and the output terminal of the stage-number switching circuit, it is not required to provide a transistor connected as a diode so as to prevent a fluctuation in a potential due to the pumping of a charge pump circuit in a previous stage and a smoothing capacitor connected so as to stabilize a potential. Therefore, a chip area can be reduced, and a decrease in boosting voltage can be suppressed with a simple circuit configuration.

In the first and second boosting circuits, it is preferable that in a case where the stage-number switching control signal is at the first voltage level, the stage-number switching circuit is allowed to be operated in the same way as in one stage of charge pump circuit by synchronizing the stage-number switching circuit with a clock signal to be input.

According to the above-mentioned configuration, the stage-number switching circuit functions as one stage of charge pump circuit in the case where the stage-number switching circuit is activated. Therefore, compared with a conventional circuit configuration, the number of charge pump circuits can be reduced by the number of switching transistors, whereby a chip area can be reduced.

In the first boosting circuit, it is preferable that the stage-number switching circuit includes: a level shift circuit that is supplied with the first or second boosting voltage as a supply voltage to shift a voltage level of the stage-number switching control signal; and a switch circuit for setting a potential of the input terminal of the second charge pump circuit group to be the same as a potential of the input terminal of the first charge pump circuit group with a signal output from the level shift circuit, in a case where the stage-number switching control signal is at the second voltage level (ground potential 0 V).

Furthermore, in the first and second boosting circuits, it is preferable that the stage-number switching circuit includes a gate circuit for enabling or disabling a clock signal to be supplied, in accordance with the stage-number switching control signal.

Furthermore, it is preferable that the first and third boosting circuits include: a first reverse flow preventing transistor connected between the output terminal of the first charge pump circuit group and an output terminal of the boosting circuit; and a second reverse flow preventing transistor connected between an output terminal of the second charge pump circuit group and an output terminal of the boosting circuit.

Furthermore, it is preferable that the second boosting circuit includes a reverse flow preventing transistor connected between an output terminal of the third charge pump circuit group and an output terminal of the boosting circuit.

Furthermore, it is preferable that the first to third boosting circuits include a smoothing capacitor connected to the output terminal of the boosting circuit.

Furthermore, in the first and third boosting circuits, the first and second charge pump circuit groups are composed of 2-stage charge pump circuits connected in series, and clock signals supplied to the 2-stage charge pump circuits are composed of 4 kinds of clock signals having different phases.

Furthermore, in the second boosting circuit, the first, second, and third charge pump circuit groups are composed of 2-stage charge pump circuits connected in series, and clock signals supplied to the 2-stage charge pump circuits are composed of 4 kinds of clock signals having different phases.

Furthermore, in the first to third boosting circuits, the charge-pump circuit includes: a charge transfer transistor having a current channel connected between an input terminal and an output terminal of the charge pump circuit; a threshold canceling transistor having a current channel connected to an input terminal and a gate of the charge transfer transistor; a first coupling capacitor, one electrode of which is connected to a gate of the charge transfer transistor and the other electrode of which is supplied with a clock signal; and a second coupling capacitor, one electrode of which is connected to a gate of the threshold canceling transistor and the other electrode of which is supplied with a clock signal.

Furthermore, in the first to third boosting circuits, transistors constituting the charge pump circuit and the stage-number switching circuit are N-channel MOS transistors, and the boosting circuit outputs a boosted positive voltage.

Furthermore, in the first to third boosting circuits, transistors constituting the charge pump circuit and the stage-number switching circuit are P-channel MOS transistors, and the boosting circuit outputs a boosted negative voltage.

In order to achieve the above-mentioned object, a non-volatile semiconductor storage device of the present invention includes: any of the first to third boosting circuits; a non-volatile memory cell array that is supplied with a boosting voltage from the boosting circuit; and a stage-number switching control circuit for switching a voltage level of a stage-number switching control signal to a first or second voltage level, in accordance with an operation mode of a memory.

These and other advantages of the present invention will become apparent to those skilled in the art upon reading and understanding the following detailed description with reference to the accompanying figures.

BRIEF DESCRIPTION OF THE DRAWINGS

FIG. 2 is a circuit diagram showing one exemplary internal configuration of a stage-number switching circuit 20 shown in FIG. 1 as a stage-number switching circuit 20a.

DESCRIPTION OF THE PREFERRED EMBODIMENTS

Hereinafter, the present invention will be described by way of illustrative embodiments with reference to the drawings.

Embodiment 1

Figure 1:
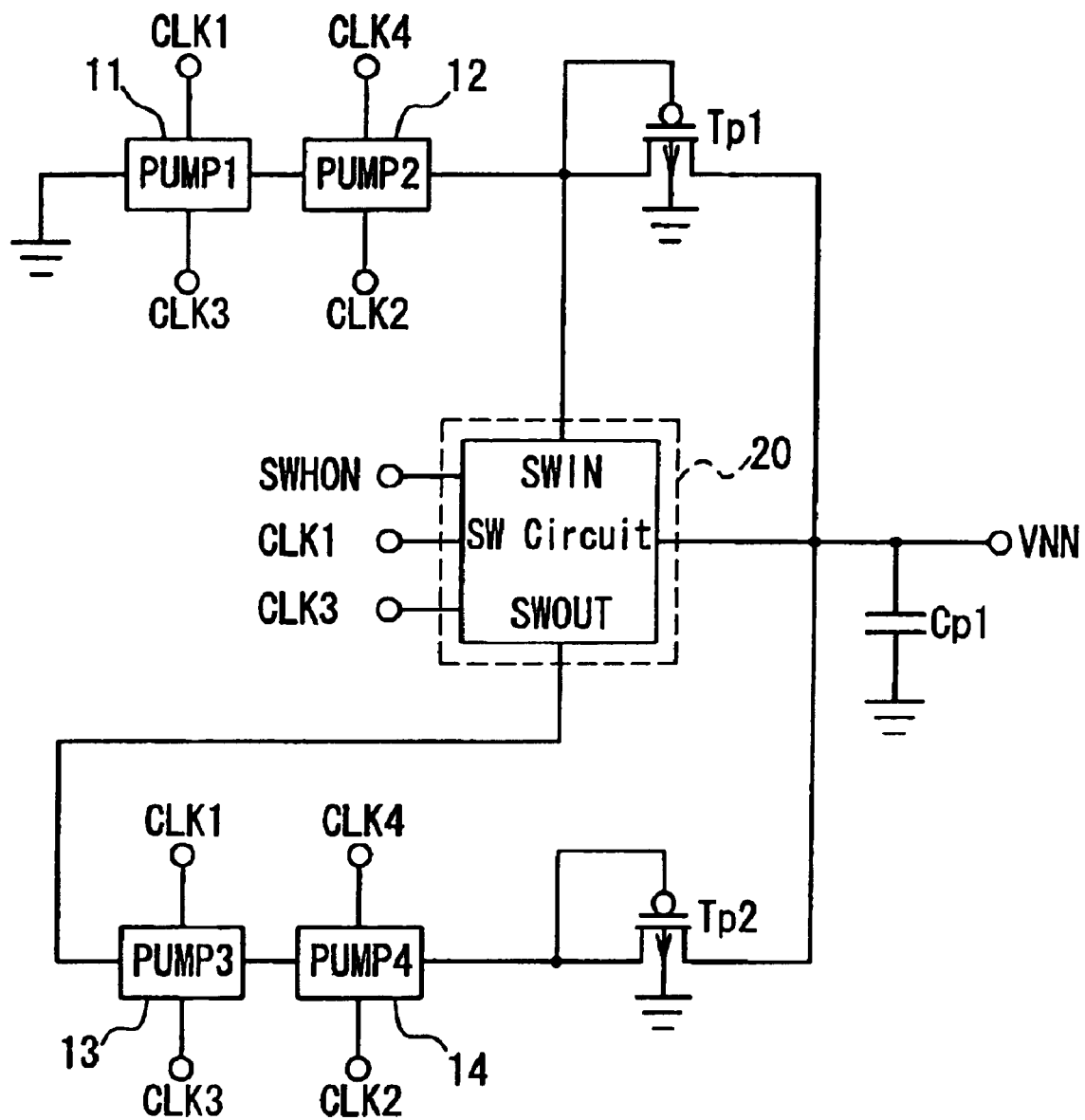
FIG. 1 is a circuit block diagram showing an exemplary configuration of a negative boosting circuit for generating a negative high voltage, as a boosting circuit according to Embodiment 1 of the present invention.
Figure 9:
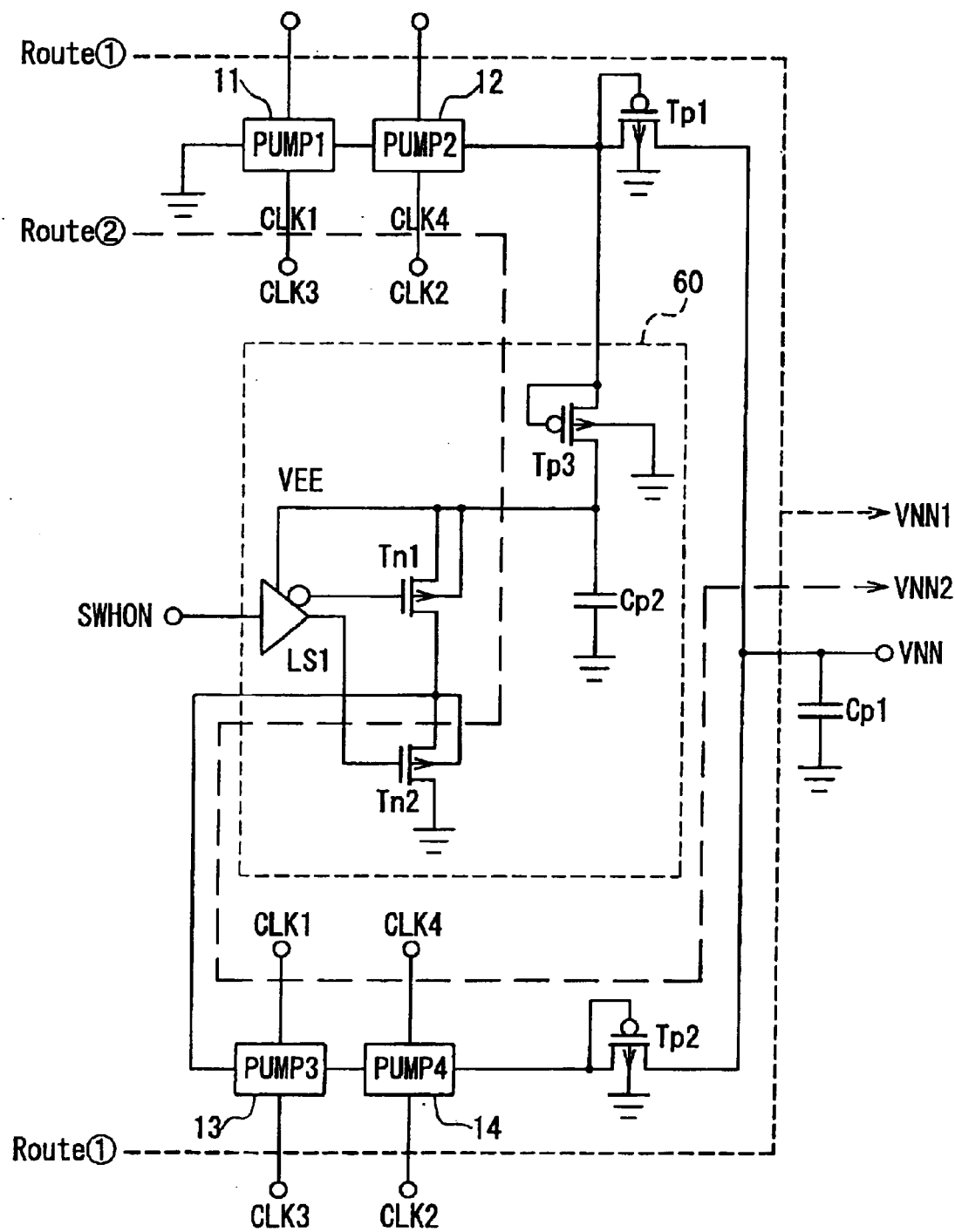
FIG. 9 is a circuit block diagram showing an exemplary configuration of a negative boosting circuit for generating a negative high voltage, as a conventional boosting circuit.

FIG. 1 is a circuit block diagram showing an exemplary configuration of a negative boosting circuit for generating negative high voltages different in voltage level, as a boosting circuit according to Embodiment 1 of the present invention. In FIG. 1, components having the same configurations and functions as those in the prior art shown in FIG. 9 are denoted with the same reference numerals as those therein, and the description thereof will be omitted here.

The present embodiment is different from the prior art in the configuration of a stage-number switching circuit (SW circuit) 20. Hereinafter, the configuration and operation of the stage-number switching circuit 20 will be described mainly.

In FIG. 1, the stage-number switching circuit 20 is deactivated in the case where a stage-number switching control signal SWHON is at a logic low level, and a negative boosting circuit has a configuration in which 2-stage charge pump circuits 11, 12 are connected in parallel with 2-stage charge-pump circuits 13, 14. On the other hand, the stage-number switching circuit 20 is activated in the case where the stage-number switching control signal SWHON is at a logic high level, and the 2-stage charge pump circuits 11, 12 are connected in series with the 2-stage charge pump circuits 13, 14. This is the same as the prior art.

However, the stage-number switching circuit 20 in the present embodiment is different from the prior art in that the stage-number switching circuit 20 is supplied with clock signals CLK1, CLK3, and an output voltage VNN.

Figure 2:
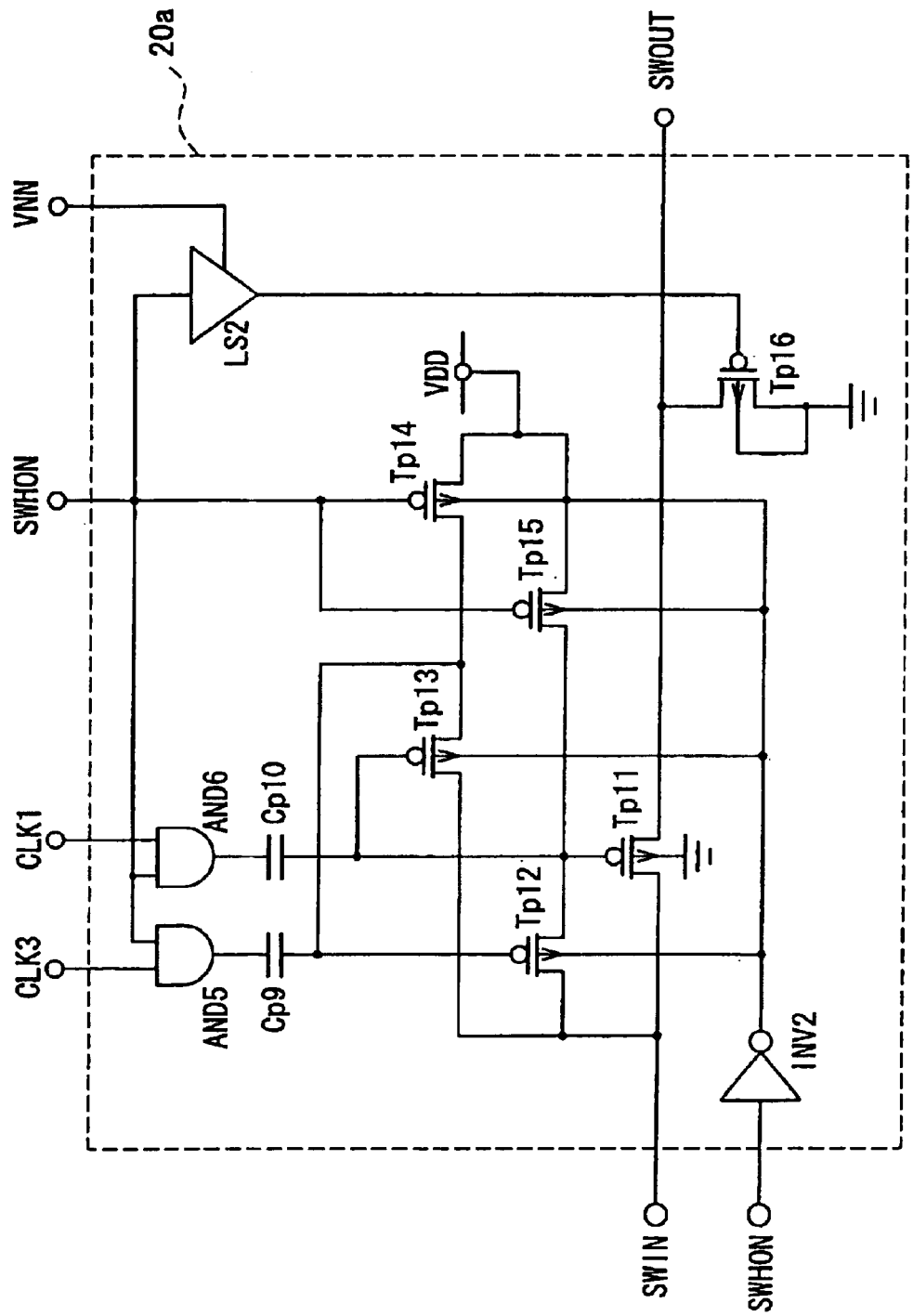

FIG. 2 is a circuit diagram showing one exemplary internal configuration of the stage-number switching circuit 20 shown in FIG. 1, as a stage-number switching circuit 20a. In FIG. 2, Tp11 to Tp16 denote P-channel MOS transistors; Cp9, Cp10 denote capacitors pumped with the clock signals CLK3, CLK1, respectively; LS2 denotes a level shift circuit for shifting the voltage level of the stage-number switching control signal SWHON from a positive supply voltage VDD to a negative supply voltage VNN; AND5, AND6 denote AND circuits for enabling or disabling the clock signals CLK1, CLK3 to be input to the stage-number switching circuit 20a; and INV2 denotes an inverter circuit for switching the substrate voltages of the P-channel MOS transistors Tp12 to Tp15 with the stage-number switching control signal SWHON.

Hereinafter, the operation of the stage-number switching circuit 20a thus configured will be described.

Figure 11:
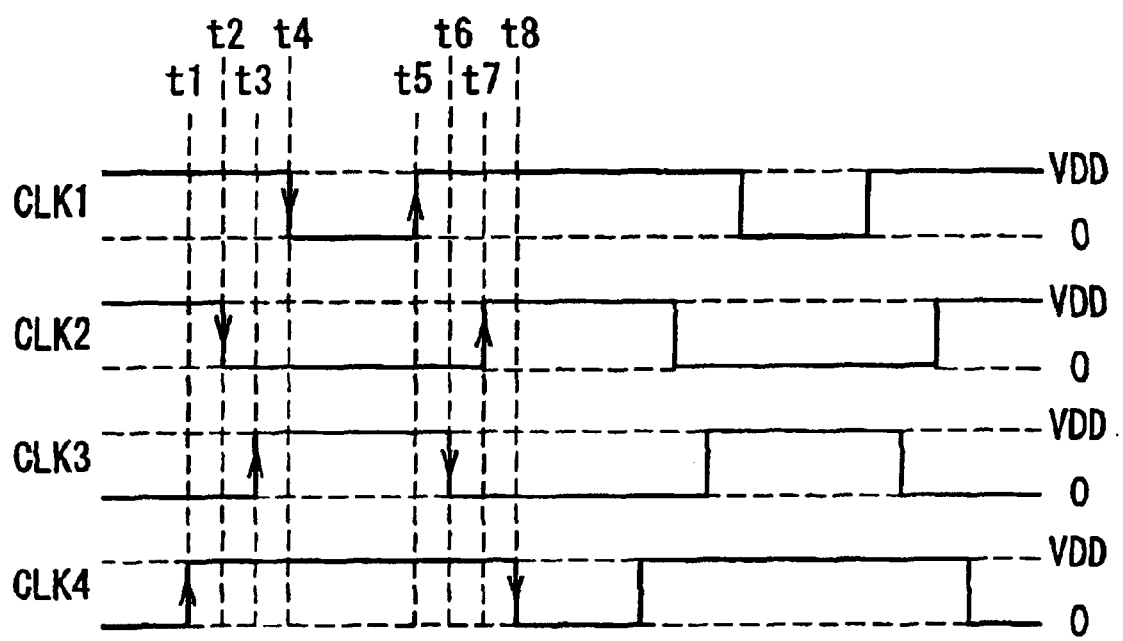
FIG. 11 is a timing chart of clock signals CLK1 to CLK4 supplied to the 2-stage charge pump circuit shown in FIG. 10.

First, in the case where the stage-number switching circuit 20a is activated (i.e., SWHON is at a logic high level (VDD)), the gates of the P-channel MOS transistors Tp14 and Tp15 are supplied with the supply voltage VDD, so that the P-channel MOS transistors Tp14 and Tp15 are turned off. Furthermore, the clock signals CLK1 and CLK3 to be input are enabled by the AND circuits AND5 and AND6. Furthermore, the substrates of the P-channel MOS transistors Tp12 to Tp15 are supplied with 0 V. The gate of the P-channel MOS transistor Tp11 is supplied with the clock signal CLK1 shown in FIG. 11, whereby the P-channel MOS transistor Tp11 is turned on/off with a voltage lower/higher than an output voltage of a charge pump circuit 12 (FIG. 1) in the previous stage connected to an input terminal SWIN. Because of this, the voltage boosted by the charge pump circuit 12 in the previous stage connected to the input terminal SWIN is transmitted to a charge pump circuit 13 in the subsequent stage, which is connected to an output terminal SWOUT through the P-channel MOS transistor Tp11 without decreasing the boosting ability.

On the other hand, in the case where the stage-number switching circuit 20a is deactivated (i.e., SWHON is at a logic low level (0 V)), the gates of the P-channel MOS transistors Tp14 and Tp15 are supplied with a ground potential (0 V), so that the P-channel MOS transistors Tp14 and Tp15 are turned on. Furthermore, the clock signals CLK1 and CLK3 to be input are disabled by the AND circuits AND5 and AND6. Furthermore, the substrates of the P-channel MOS transistors Tp12 to Tp15 are supplied with a supply voltage VDD.

The gate of the P-channel MOS transistor Tp12 is supplied with the supply voltage VDD through the P-channel MOS transistor Tp14, and the gates of the P-channel MOS transistors Tp11 and Tp13 are supplied with the supply voltage VDD through the P-channel MOS transistor Tp15. Because of this, the P-channel MOS transistors Tp11, Tp12, and Tp13 are turned off, thereby preventing the voltage boosted by the charge pump circuit 12 in the previous stage connected to the input terminal SWIN from being transmitted to the input terminal of the charge pump circuit 13 in the subsequent stage connected to the output terminal SWOUT through the P-channel MOS transistor Tp11.

Furthermore, the gate of the P-channel MOS transistor Tp16 is supplied with a negative boosting voltage VNN from the level shift circuit LS2. Because of this, the P-channel MOS transistor Tp16 is turned on, and a ground potential (0 V) is output to the output terminal SWOUT, whereby the charge pump circuit 13 in the subsequent stage is supplied with the ground potential (0 V).

Figure 3:
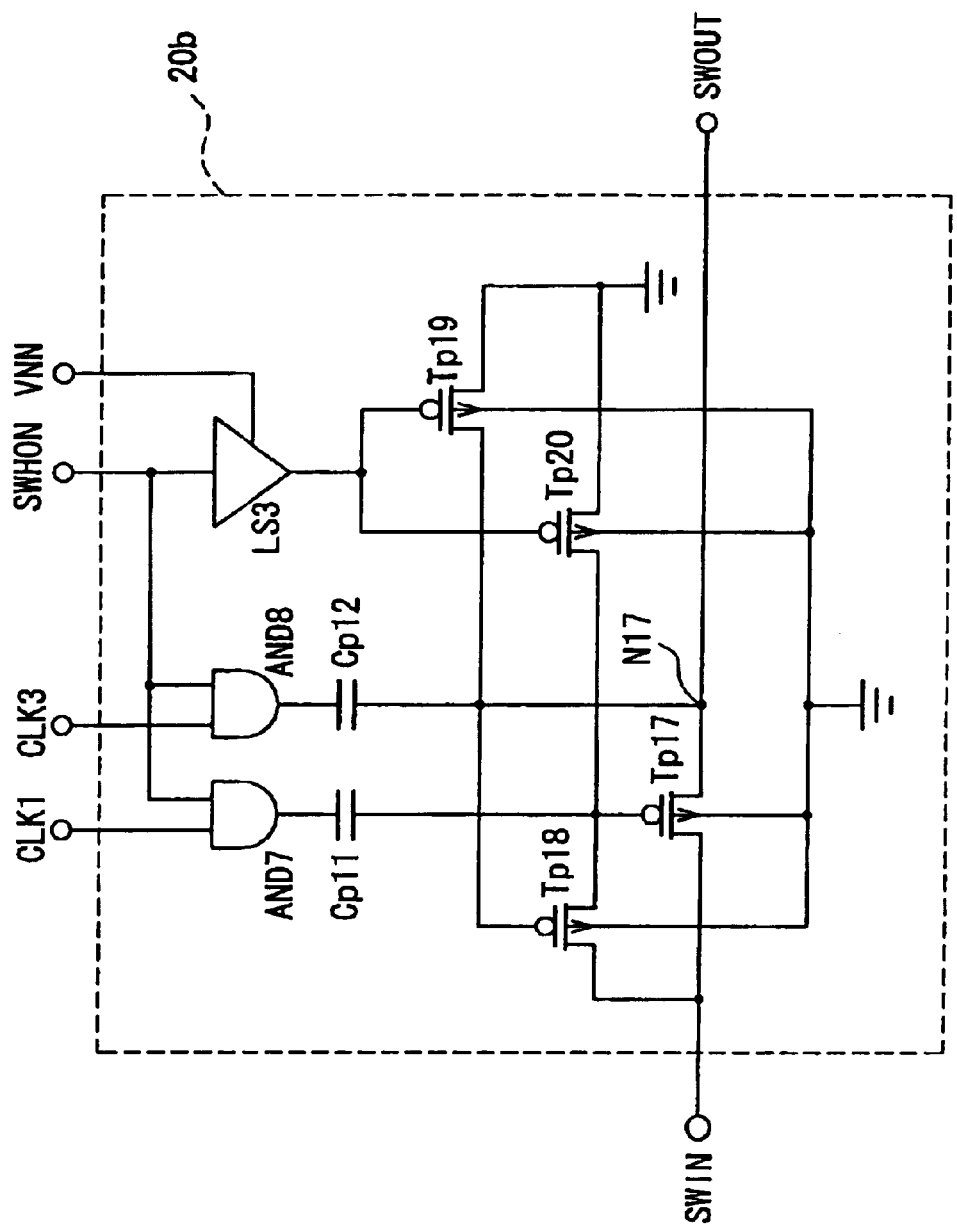
FIG. 3 is a circuit diagram showing another exemplary internal configuration of the stage-number switching circuit 20 shown in FIG. 1 as a stage-number switching circuit 20b.

FIG. 3 is a circuit diagram showing another internal exemplary configuration of the stage-number switching circuit 20 shown in FIG. 1, as a stage-number switching circuit 20b. In FIG. 3, Tp17 to 20 denote P-channel MOS transistors; Cp11 and Cp12 denote capacitors pumped with clock signals CLK1 and CLK3, respectively; LS3 denotes a level shift circuit for shifting the voltage level of a stage-number switching control signal SWHON from a positive supply voltage VDD to a negative supply voltage VNN; and AND7 and AND8 denote AND circuits for enabling or disabling the clock signals CLK1 and CLK3 to be input to the stage-number switching circuit 20b. Herein, the substrates of the P-channel MOS transistors 17 to 20 are at a ground potential (0 V).

Hereinafter, the operation of the stage-number switching circuit 20b thus configured will be described.

First, in the case where the stage-number switching circuit 20b is activated i.e., SWHON is at a logic high level), the gates of the P-channel MOS transistors Tp19 and Tp20 are supplied with a supply voltage VDD from the level shift circuit LS3. Because of this, the P-channel MOS transistors Tp19 and Tp20 are turned off. Furthermore, the clock signals CLK1 and CLK3 to be input are enabled by the AND circuits AND 7 and AND8.

Figure 10:
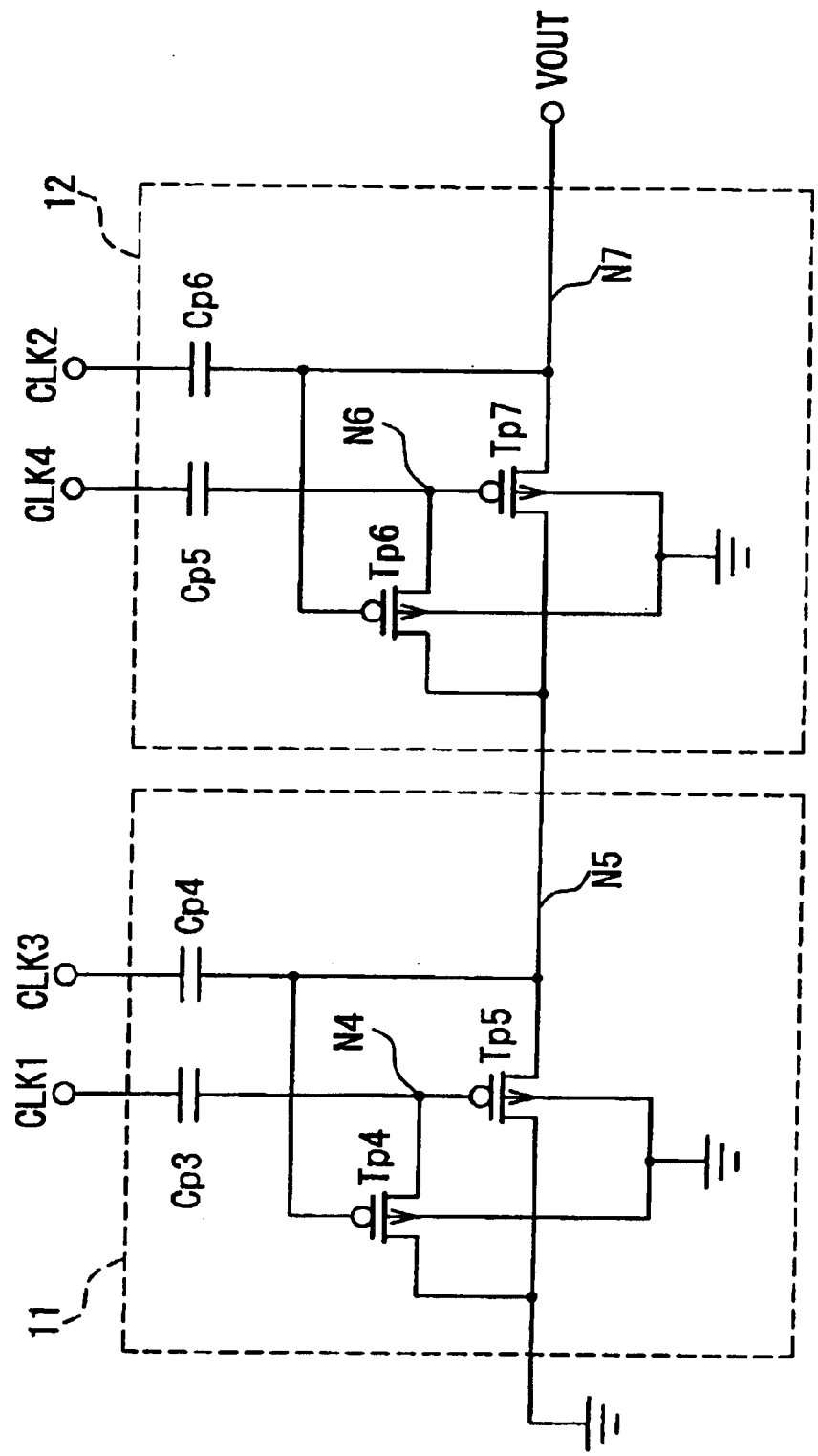
FIG. 10 is a circuit diagram showing an internal configuration of a 2-stage charge pump circuit of a threshold canceling type in the prior art and the embodiments of the present invention.

In the above-mentioned state, the stage-number switching circuit 20b has the same configuration as that of and functions in the same manner as that of one stage of a conventional charge pump circuit of a threshold canceling type shown in FIG. 10. Because of this, the voltage boosted by the charge pump circuit 12 in the previous stage connected to the input terminal SWIN is boosted further by one stage, and transmitted to the charge pump circuit 13 in the subsequent stage connected to the output terminal SWOUT without decreasing the boosting ability.

On the other hand, in the case where the stage-number switching circuit 20b is deactivated (i.e., SWHON is at a logic low level), the gates of the P-channel MOS transistors Tp19 and Tp20 are supplied with a negative boosting voltage VNN from the level shift circuit LS3. Therefore, the P-channel MOS transistors Tp19 and Tp20 are turned on.

Furthermore, the clock signals CLK1 and CLK3 to be input are disabled by the AND circuits AND7 and AND8.

The gate of the P-channel MOS transistor Tp17 is supplied with a ground potential (0 V) through the P-channel MOS transistor Tp20, and the gate of the P-channel MOS transistor Tp18 is supplied with a ground potential (0 V) through the P-channel MOS transistor Tp19. Because of this, the P-channel MOS transistors Tp17 and Tp18 are turned off, thereby preventing the voltage boosted by the charge pump circuit 12 in the previous stage connected to the input terminal SWIN from being transmitted to the input terminal of the charge pump circuit 13 in the subsequent stage connected to the output terminal SWOUT through the P-channel MOS transistor Tp17.

Furthermore, a node N17 is supplied with a ground potential (0 V) through the P-channel MOS transistor Tp19. Because of this, the ground potential (0 V) is output to the output terminal SWOUT, and the charge pump circuit 13 in the subsequent stage is supplied with the ground potential (0 V).

Figure 4:
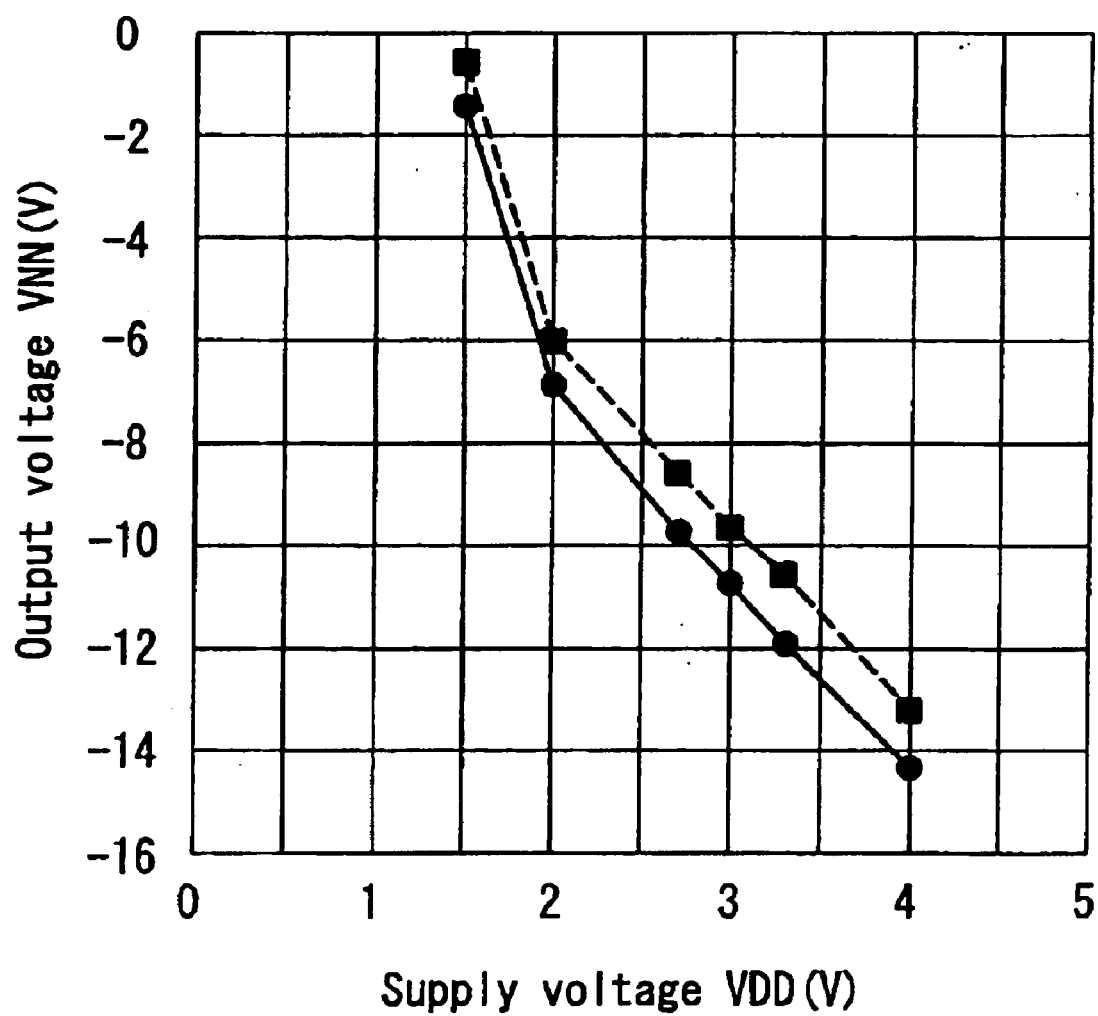
FIG. 4 is a graph obtained by plotting output voltages VNN of a negative boosting circuit (4-stage serial configuration) with respect to a supply voltage VDD in the case of using a stage-number switching circuit in Embodiment 1 and in the case of using a conventional stage-number switching circuit.

FIG. 4 shows a graph obtained by plotting an output voltage VNN of a negative boosting circuit (4-stage serial configuration) with respect to a supply voltage VDD in the case of using the stage-number switching circuit 20a in the present embodiment shown in FIG. 2 and in the case of using the conventional stage-number switching circuit 60 shown in FIG. 9. The operational efficiency of the charge pump circuit at this time is set to be 90% (in the case of a 4-stage configuration, −0.9 VDD×4 is an output voltage VNN of a negative boosting circuit). In FIG. 4, a solid line represents a change in the output voltage VNN with respect to the supply voltage VDD in the present embodiment, and a broken line represents a change in the output voltage VNN with respect to a supply voltage VDD in the prior art. As shown in FIG. 4, when the present embodiment is compared with the prior art, the output voltage VNN of the present embodiment is higher than that of the prior art, and the boosting efficiency can be enhanced.

Embodiment 2

Figure 5:
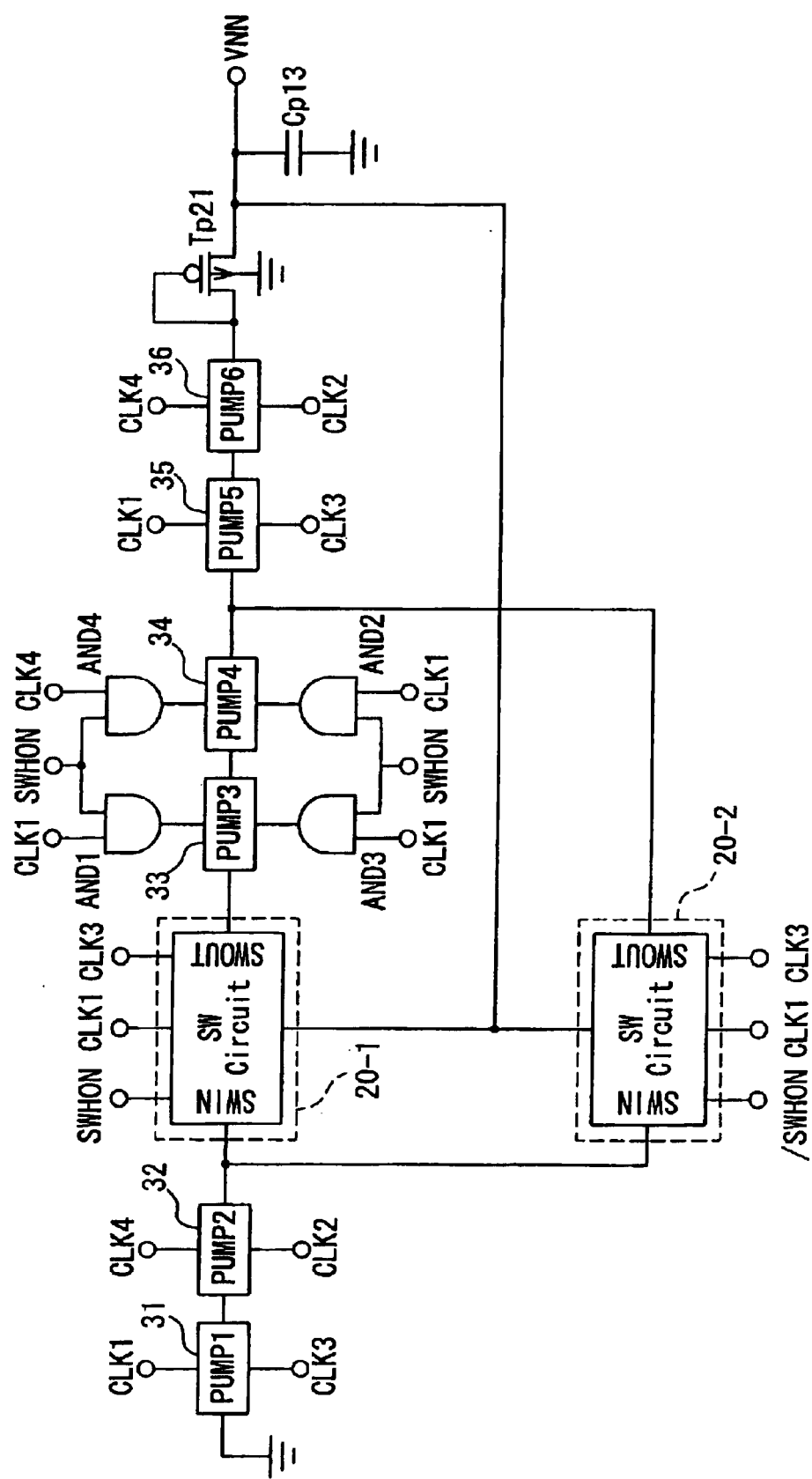
FIG. 5 is a circuit block diagram showing an exemplary configuration of a negative boosting circuit for generating a negative high voltage, as a boosting circuit according to Embodiment 2 of the present invention.

FIG. 5 is a circuit block diagram showing an exemplary configuration of a negative boosting circuit for generating negative high voltages different in voltage level, as a boosting circuit according to Embodiment 2 of the present invention. In the present embodiment, the case will be described in which charge pump circuits are switched between a 4-stage serial configuration and a 6-stage serial configuration.

In FIG. 5, 2-stage charge pump circuits 31 and 32, 2-stage charge pump circuits 33 and 34, and 2-stage charge pump circuits 35 and 36 have the same configuration as that of the 2-stage charge pump circuits 11 and 12 shown in FIG. 10.

AND1 to AND4 denote AND circuits for enabling or disabling clock signals CLK1 to CLK4 to be input to the 2-stage charge pump circuits 33 and 34; Tp21 denotes a P-channel MOS transistor connected as a diode for preventing a reverse flow; and Cp13 denotes a capacitor for smoothing an output.

20-1 and 20-2 denote stage-number switching circuits for switching the number of stages of the charge pump circuits, and have the configuration as shown in FIG. 2 or 3.

Hereinafter, the operation of the negative boosting circuit thus configured will be described.

First, in the case where the stage-number switching circuit 20-1 is activated (i.e., SWHON is at a logic high level), and the stage-number switching circuit 20-2 is deactivated (i.e., SWHON is at a logic low level), 6-stage charge pump circuits 31 to 36 are connected in series with each other.

On the other hand, in the case where the stage-number switching circuit 20-1 is deactivated (i.e., SWHON is at a logic high level), and the stage-number switching circuit 20-2 is activated (SWHON is at a logic high level), the clock signals CLK1 to CLK4 to be input to the 2-stage charge pump circuits 33 and 34 are disabled by the AND circuits AND1 to AND4, and the boosting operation of the 2-stage charge pump circuits 33 and 34 is suspended, whereby the 4-stage charge pump circuits 31, 32, 35, and 36 are connected in series with each other.

Embodiment 3

Figure 6:
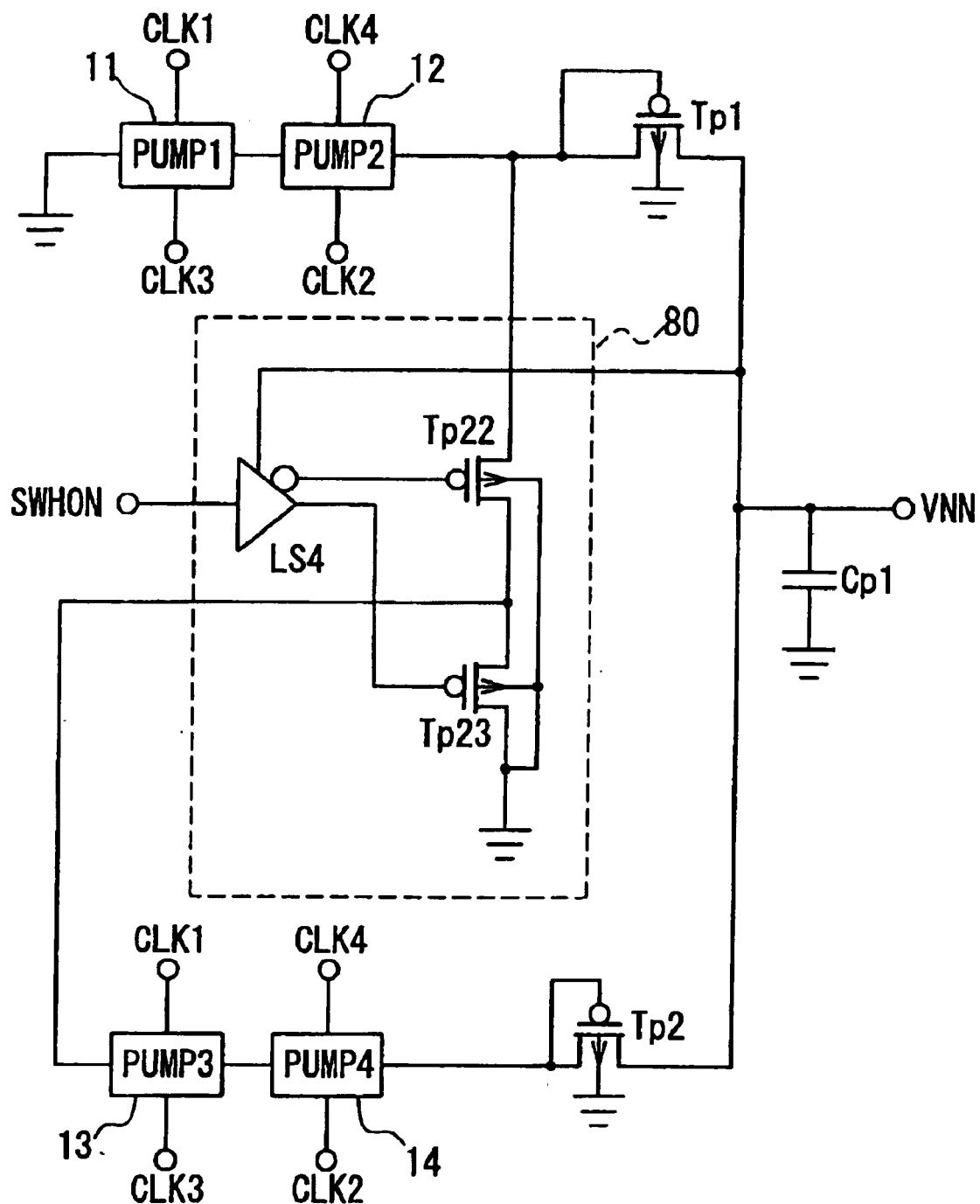
FIG. 6 is a circuit block diagram showing an exemplary configuration of a negative boosting circuit for generating a negative high voltage, as a boosting circuit according to Embodiment 3 of the present invention.

FIG. 6 is a circuit block diagram showing an exemplary configuration of a negative boosting circuit for generating negative high voltages different in voltage level, as a boosting circuit according to Embodiment 3 of the present invention. In FIG. 6, components having the same configurations and functions as those in the prior art shown in FIG. 9 are denoted with the same reference numerals as those therein, and the description thereof will be omitted here.

The present embodiment is different from the prior art in the configuration of a stage-number switching circuit (SW circuit) 80. Hereinafter, the configuration and operation of the stage-number switching circuit 80 will be described mainly.

In FIG. 6, the stage-number switching circuit 80 is composed of P-channel MOS transistors Tp22 and Tp23, and a negative level shift circuit LS4. Herein, the level shift circuit LS4 is supplied with an output voltage VNN of a negative boosting circuit as a supply voltage.

Hereinafter, the operation of the stage-number switching circuit 80 thus configured will be described.

First, in the case where the stage-number switching circuit 80 is activated (i.e., SWHON is at a logic high level), the gate of the P-channel MOS transistor Tp22 is supplied with an output voltage VNN of a negative boosting circuit that is an inverted output voltage of the negative level shift circuit LS4. Since a source voltage and a drain voltage of the P-channel MOS transistor Tp22 are higher than a gate voltage by a threshold value or more, the P-channel MOS transistor Tp22 is turned on. On the other hand, the gate of the P-channel MOS transistor Tp23 is supplied with a supply voltage VDD that is a noninverted output voltage of the negative level shift circuit LS4. Since a source voltage and a drain voltage of the P-channel MOS transistor Tp23 is lower than a gate voltage by a threshold value or more, the P-channel MOS transistor Tp23 is turned off. As a result, the voltage boosted by the charge pump circuit 12 in the previous stage of the stage-number switching circuit 80 can be supplied to the charge pump circuit 13 in the subsequent stage through the stage-number switching circuit 80 without being decreased.

On the other hand, in the case where the stage-number switching circuit 80 is deactivated (i.e., SWHON is at a logic low level), the gate of the P-channel transistor Tp22 is supplied with a supply voltage VDD that is an inverted output voltage of the negative level shift circuit LS4, and the P-channel transistor Tp22 is turned off. Because of this, the voltage boosted by the charge pump circuit 12 in the previous stage of the stage-number switching circuit 80 is prevented from being supplied to the charge pump circuit 13 in the subsequent stage through the stage-number switching circuit 80.

Furthermore, the gate of the P-channel MOS transistor Tp23 is supplied with an output voltage VNN of a negative boosting circuit that is a noninverted output voltage of the negative level shift circuit LS4, so that the P-channel MOS transistor Tp23 is turned on. Because of this, the charge pump circuit 13 in the subsequent stage is supplied with a ground potential (0 V).

Figure 7:
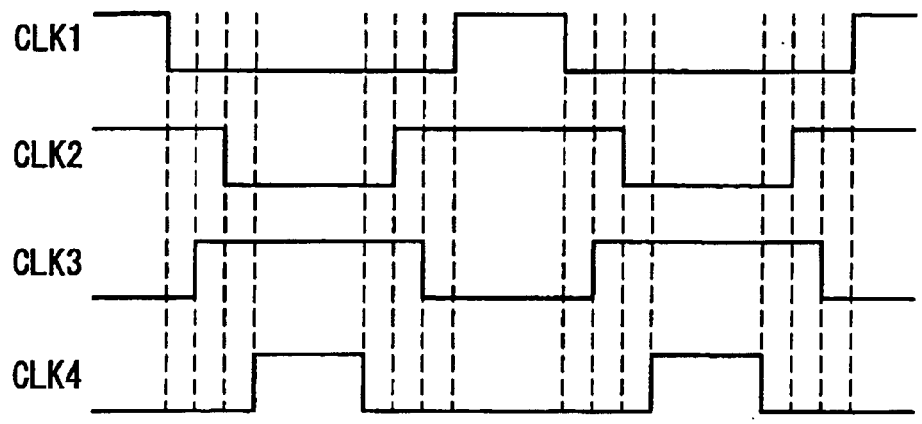
FIG. 7 is a timing chart of clock signals CLK1 to CLK4 for operating a negative boosting circuit in the embodiments of the present invention, as a positive boosting circuit for generating a positive high voltage.

In the above-mentioned embodiments 1 to 3, the negative boosting circuit has been illustrated and described. However, the present invention also is applicable to a positive boosting circuit. In this case, all the P-channel MOS transistors constituting a negative boosting circuit are replaced with N-channel MOS transistors and the connection of substrates is changed so as not to cause a reverse flow. Furthermore, a negative level shift circuit is replaced with a positive level shift circuit, and clock signals CLK1 to CLK4 are input at a timing as shown in FIG. 7. Thus, a positive boosting circuit having a stage-number switching circuit can be configured.

Embodiment 4

Figure 8:
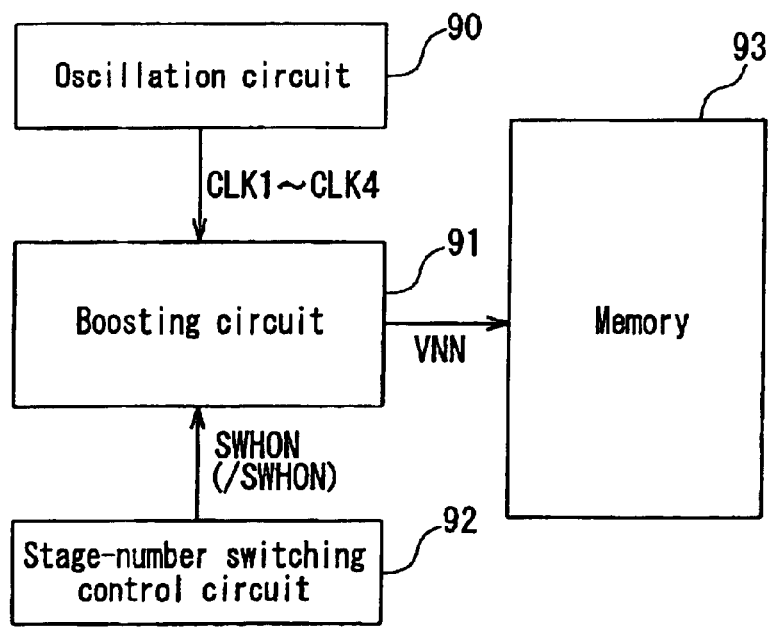
FIG. 8 is a block diagram showing an exemplary configuration of a non-volatile semiconductor storage device according to Embodiment 4 of the present invention.

FIG. 8 is a block diagram showing an exemplary configuration of a non-volatile semiconductor storage device according to Embodiment 4 of the present invention. The non-volatile semiconductor storage device of the present embodiment contains a boosting circuit of any one of Embodiments 1 to 3, or a combination thereof.

In FIG. 8, reference numeral 90 denotes an oscillation circuit, 91 denotes a boosting circuit having a stage-number switching circuit, 92 denotes a stage-number switching control circuit, and 93 denotes a memory.

Hereinafter, the operation of the non-volatile semiconductor storage device thus configured will be described.

First, the boosting circuit 91 having a stage-number switching circuit is operated in synchronization with clock signals CLK1 to CLK4 generated in the oscillation circuit 90, in accordance with a stage-number switching control signal SWHON (SWHON) from the stage-number switching control circuit 92, and a boosting voltage VNN is generated and supplied to the memory 93.

The boosting voltage VNN supplied to the memory 93 is varied by the stage-number switching control circuit 92. For example, the boosting voltage VNN to be supplied to the memory 93 can be switched between the case in which large current ability is required while a boosting voltage is low as in reading from a memory and the case where small current ability is required while a boosting voltage is high as in writing in a memory. Thus, a number of kinds of boosting voltages can be generated efficiently in one boosting circuit in accordance with the purpose, and can be supplied to the memory 93.

As described above, the present invention has the special effect as follows: a boosting circuit can be realized, in which a boosting efficiency is enhanced without increasing a chip area, and a time required for reaching a desired boosting voltage different in a voltage level and current ability is shortened, and a non-volatile semiconductor storage device containing the boosting circuit can be realized.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A boosting circuit having charge pump circuits for generating a boosting voltage with respect to a predetermined potential by allowing charge to move through a charge transfer transistor in synchronization with a clock signal input through a capacitor, comprising:

a first charge pump circuit group in which the charge pump circuits are connected in series of n stages (n is an integer of 2 or more) to each other;

a second charge pump circuit group in which the charge pump circuits are connected in series of m stages (m is an integer of 2 or more) to each other; and a stage-number switching circuit for switching an output terminal of the first charge pump circuit group and an input terminal of the second charge pump circuit group between a connected state and an unconnected state in accordance with a stage-number switching control signal, in such a manner that the first charge pump circuit group and the second charge pump circuit group are connected in series with each other and the second charge pump circuit group outputs a first boosting voltage, or the first charge pump circuit group and the second charge pump circuit group are connected in parallel with each other and the first and second charge pump circuit groups output a second boosting voltage, wherein the stage-number switching circuit includes:

a switching transistor having a current channel connected between the output terminal of the first charge pump circuit group and the input terminal of the second charge pump circuit group; and a capacitor, one electrode of which is supplied with a clock signal synchronized with a clock signal input to the charge pump circuit and the other electrode of which is connected to a gate of the switching transistor, and in a case where the stage-number switching control signal is at a first voltage level, the switching transistor is turned on with a supplied clock signal, and in a case where the stage-number switching control signal is at a second voltage level, the switching transistor is turned off.

2. The boosting circuit according to claim 1, wherein in a case where the stage-number switching control signal is at the first voltage level, the stage-number switching circuit is allowed to be operated in the same way as in one stage of charge pump circuit by synchronizing the stage-number switching circuit with a clock signal to be input.

3. The boosting circuit according to claim 1, wherein the stage-number switching circuit comprises:

a level shift circuit that is supplied with the first or second boosting voltage as a supply voltage to shift a voltage level of the stage-number switching control signal; and a switch circuit for setting a potential of the input terminal of the second charge pump circuit group to be the same as a potential of the input terminal of the first charge pump circuit group with a signal output from the level shift circuit, in a case where the stage-number switching control signal is at the second voltage level.

4. The boosting circuit according to claim 1, wherein the stage-number switching circuit comprises a gate circuit for enabling or disabling a clock signal to be supplied, in accordance with the stage-number switching control signal.

5. The boosting circuit according to claim 1, further comprising:

a first reverse flow preventing transistor connected between the output terminal of the first charge pump circuit group and an output terminal of the boosting circuit; and a second reverse flow preventing transistor connected between an output terminal of the second charge pump circuit group and an output terminal of the boosting circuit.

6. The boosting circuit according to claim 5, further comprising a smoothing capacitor connected to the output terminal of the boosting circuit.

7. The boosting circuit according to claim 1, wherein the first and second charge pump circuit groups are composed of 2-stage charge pump circuits connected in series, and clock signals supplied to the 2-stage charge pump circuits are composed of 4 kinds of clock signals having different phases.

8. The boosting circuit according to claim 1, wherein the charge-pump circuit comprises:
   a charge transfer transistor having a current channel connected between an input terminal and an output terminal of the charge pump circuit;
   a threshold canceling transistor having a current channel connected to the input terminal and a gate of the charge transfer transistor;
   a first coupling capacitor, one electrode of which is connected to a gate of the charge transfer transistor and the other electrode of which is supplied with a clock signal; and
   a second coupling capacitor, one electrode of which is connected to a gate of the threshold canceling transistor and the other electrode of which is supplied with a clock signal.

9. The boosting circuit according to claim 1, wherein a transistor constituting the charge pump circuit is an N-channel MOS transistor, and the boosting circuit outputs a boosted positive voltage.

10. The boosting circuit according to claim 1, wherein a transistor constituting the charge pump circuit is a P-channel MOS transistor, and the boosting circuit outputs a boosted negative voltage.

11. The boosting circuit according to claim 9, wherein a transistor constituting the stage-number switching circuit is an N-channel MOS transistor.

12. The boosting circuit according to claim 10, wherein a transistor constituting the stage-number switching circuit is a P-channel MOS transistor.

13. A boosting circuit having charge pump circuits for generating a boosting voltage with respect to a predetermined potential by allowing charge to move through a charge transfer transistor in synchronization with a clock signal input through a capacitor, comprising:
   a first charge pump circuit group in which the charge pump circuits are connected in series of n stages (n is an integer of 2 or more) to each other;
   a second charge pump circuit group in which the charge pump circuits are connected in series of m stages (m is an integer of 2 or more) to each other;
   a third charge pump circuit group connected in series with the second charge pump circuit group, in which the charge pump circuits are connected in series of p stages (p is an integer of 2 or more) to each other, and which outputs a first or second boosting voltage;
   a first stage-number switching circuit for switching an output terminal of the first charge pump circuit group and an input terminal of the second charge pump circuit group between a connected state and an unconnected state in accordance with a first stage-number switching control signal;
   a gate circuit for enabling or disabling a clock signal supplied to the second charge pump circuit group in accordance with the first stage-number switching control signal; and
   a second stage-number switching circuit for switching the output terminal of the first charge pump circuit group and an input terminal of the third charge pump circuit group between a connected state and an unconnected state, in accordance with a second stage-number switching control signal that is a logic inverse signal of the first stage-number switching control signal,
   wherein the first stage-number switching circuit includes:
      a first switching transistor having a current channel connected between the output terminal of the first charge pump circuit group and the input terminal of the second charge pump circuit group; and
      a first capacitor, one electrode of which is supplied with a clock signal synchronized with a clock signal input to the charge pump circuit, and the other electrode of which is connected to a gate of the first switching transistor,
   in a case where the first stage-number switching control signal is at a first voltage level, the first switching transistor is turned on with a supplied clock signal, and in a case where the first stage-number switching control signal is at a second voltage level, the first switching transistor is turned off,
   wherein the second stage-number switching circuit includes:
      a second switching transistor having a current channel connected between the output terminal of the first charge pump circuit group and the input terminal of the third charge pump circuit group; and
      a second capacitor, one electrode of which is supplied with a clock signal synchronized with a clock signal input to the charge pump circuit, and the other electrode of which is connected to a gate of the second switching transistor,
   in a case where the second stage-number switching control signal is at the first voltage level, the second switching transistor is turned on with a supplied clock signal, and in a case where the second stage-number switching control signal is at the second voltage level, the second switching transistor is turned off.

14. The boosting circuit according to claim 13, wherein in a case where the stage-number switching control signal is at the first voltage level, the stage-number switching circuit is allowed to be operated in the same way as in one stage of charge pump circuit by synchronizing the stage-number switching circuit with a clock signal to be input.

15. The boosting circuit according to claim 13, wherein the stage-number switching circuit includes a gate circuit for enabling or disabling a clock signal to be supplied, in accordance with the stage-number switching control signal.

16. The boosting circuit according to claim 13, further comprising a reverse flow preventing transistor connected between an output terminal of the third charge pump circuit group and an output terminal of the boosting circuit.

17. The boosting circuit according to claim 16, further comprising a smoothing capacitor connected to the output terminal of the boosting circuit.

18. The boosting circuit according to claim 13, wherein the first, second, and third charge pump circuit groups are composed of 2-stage charge pump circuits connected in series, and clock signals supplied to the 2-stage charge pump circuits are composed of 4 kinds of clock signals having different phases.

19. The boosting circuit according to claim 13, wherein the charge-pump circuit comprises:
   a charge transfer transistor having a current channel connected between an input terminal and an output terminal of the charge pump circuit;
   a threshold canceling transistor having a current channel connected to the input terminal and a gate of the charge transfer transistor;

a first coupling capacitor, one electrode of which is connected to a gate of the charge transfer transistor and the other electrode of which is supplied with a clock signal; and a second coupling capacitor, one electrode of which is connected to a gate of the threshold canceling transistor and the other electrode of which is supplied with a clock signal.

20. The boosting circuit according to claim 13, wherein a transistor constituting the charge pump circuit is an N-channel MOS transistor, and the boosting circuit outputs a boosted positive voltage.

21. The boosting circuit according to claim 13, wherein a transistor constituting the charge pump circuit is a P-channel MOS transistor, and the boosting circuit outputs a boosted negative voltage.

22. The boosting circuit according to claim 20, wherein a transistor constituting the stage-number switching circuit is an N-channel MOS transistor.

23. The boosting circuit according to claim 21, wherein a transistor constituting the stage-number switching circuit is a P-channel MOS transistor.

24. A boosting circuit having charge pump circuits for generating a boosting voltage with respect to a predetermined potential by allowing charge to move through a charge transfer transistor in synchronization with a clock signal input through a capacitor, comprising:

a first charge pump circuit group in which the charge pump circuits are connected in series of n stages (n is an integer of 2 or more) to each other;

a second charge pump circuit group in which the charge pump circuits are connected in series of m stages (in is an integer of 2 or more) to each other; and a stage-number switching circuit for switching an output terminal of the first charge pump circuit group and an input terminal of the second charge pump circuit group between a connected state and an unconnected state in accordance with a stage-number switching control signal, in such a manner that the first charge pump circuit group and the second charge pump circuit group are connected in series with each other and the second charge pump circuit group outputs a first boosting voltage, or the first charge pump circuit group and the second charge pump circuit group are connected in parallel with each other and the first and second charge pump circuit groups output a second boosting voltage, wherein the stage-number switching circuit includes:

a level shift circuit that is supplied with the first or second boosting voltage as a supply voltage to shift a voltage level of the stage-number switching control signal; and a switch circuit for switching an output terminal of the first charge pump circuit group and an input terminal of the second charge pump circuit group between a connected state and an unconnected state, in accordance with a signal output from the level shift circuit.

25. The boosting circuit according to claim 24, wherein the switch circuit sets a potential of the input terminal of the second charge pump circuit group to be the same as a potential of the input terminal of the first charge pump circuit group with a signal output from the level shift circuit, in a case where the stage-number switching control signal is at the second voltage level.

26. The boosting circuit according to claim 24, further comprising:

a first reverse flow preventing transistor connected between the output terminal of the first charge pump circuit group and an output terminal of the boosting circuit; and a second reverse flow preventing transistor connected between an output terminal of the second charge pump circuit group and an output terminal of the boosting circuit.

27. The boosting circuit according to claim 26, further comprising a smoothing capacitor connected to the output terminal of the boosting circuit.

28. The boosting circuit according to claim 24, wherein the first and second charge pump circuit groups are composed of 2-stage charge pump circuits connected in series, and clock signals supplied to the 2-stage charge pump circuits are composed of 4 kinds of clock signals having different phases.

29. The boosting circuit according to claim 24, wherein the charge-pump circuit comprises:

a charge transfer transistor having a current channel connected between an input terminal and an output terminal of the charge pump circuit;

a threshold canceling transistor having a current channel connected to the input terminal and a gate of the charge transfer transistor;

a first coupling capacitor, one electrode of which is connected to a gate of the charge transfer transistor and the other electrode of which is supplied with a clock signal; and a second coupling capacitor, one electrode of which is connected to a gate of the threshold canceling transistor and the other electrode of which is supplied with a clock signal.

30. The boosting circuit according to claim 24, wherein a transistor constituting the charge pump circuit is an N-channel MOS transistor, and the boosting circuit outputs a boosted positive voltage.

31. The boosting circuit according to claim 24, wherein a transistor constituting the charge pump circuit is a P-channel MOS transistor, and the boosting circuit outputs a boosted negative voltage.

32. The boosting circuit according to claim 30, wherein a transistor constituting the stage-number switching circuit is an N-channel MOS transistor.

33. The boosting circuit according to claim 31, wherein a transistor constituting the stage-number switching circuit is a P-channel MOS transistor.

34. A non-volatile semiconductor storage device, comprising:

a boosting circuit;

a non-volatile memory cell array that is supplied with a boosting voltage from the boosting circuit; and a stage-number switching control circuit for switching a voltage level of a stage-number switching control signal to a first or second voltage level, in accordance with an operation mode of a memory, wherein the boosting circuit has charge pump circuits for generating a boosting voltage with respect to a predetermined potential by allowing charge to move through a charge transfer transistor in synchronization with a clock signal input through a capacitor, the boosting circuit comprising:

a first charge pump circuit group in which the charge pump circuits are connected in series of n stages (n is an integer of 2 or more) to each other;

a second charge pump circuit group in which the charge pump circuits are connected in series of m stages (m is an integer of 2 or more) to each other; and a stage-number switching circuit for switching an output terminal of the first charge pump circuit group and an input terminal of the second charge pump circuit group between a connected state and an unconnected state in accordance with a stage-number switching control signal, in such a manner that the first charge pump circuit group and the second charge pump circuit group are connected in series with each other and the second charge pump circuit group outputs a first boosting voltage, or the first charge pump circuit group and the second charge pump circuit group are connected in parallel with each other and the first and second charge pump circuit groups output a second boosting voltage, wherein the stage-number switching circuit includes:
a switching transistor having a current channel connected between the output terminal of the first charge pump circuit group and the input terminal of the second charge pump circuit group; and
a capacitor, one electrode of which is supplied with a clock signal synchronized with a clock signal input to the charge pump circuit and the other electrode of which is connected to a gate of the switching transistor, and in a case where the stage-number switching control signal is at a first voltage level, the switching transistor is turned on with a supplied clock signal, and in a case where the stage-number switching control signal is at a second voltage level, the switching transistor is turned off.

35. A non-volatile semiconductor storage device, comprising:
a boosting circuit;
a non-volatile memory cell array that is supplied with a boosting voltage from the boosting circuit; and
a stage-number switching control circuit for switching a voltage level of a stage-number switching control signal to a first or second voltage level, in accordance with an operation mode of a memory,
wherein the boosting circuit has charge pump circuits for generating a boosting voltage with respect to a predetermined potential by allowing charge to move through a charge transfer transistor in synchronization with a clock signal input through a capacitor, the boosting circuit comprising:
a first charge pump circuit group in which the charge pump circuits are connected in series of n stages (n is an integer of 2 or more) to each other;
a second charge pump circuit group in which the charge pump circuits are connected in series of m stages (m is an integer of 2 or more) to each other;
a third charge pump circuit group connected in series with the second charge pump circuit group, in which the charge pump circuits are connected in series of p stages (p is an integer of 2 or more) to each other, and which outputs a first or second boosting voltage;
a first stage-number switching circuit for switching an output terminal of the first charge pump circuit group and an input terminal of the second charge pump circuit group between a connected state and an unconnected state in accordance with a first stage-number switching control signal;
a gate circuit for enabling or disabling a clock signal supplied to the second charge pump circuit group in accordance with the first stage-number switching control signal; and a second stage-number switching circuit for switching the output terminal of the first charge pump circuit group and an input terminal of the third charge pump circuit group between a connected state and an unconnected state, in accordance with a second stage-number switching control signal that is a logic inverse signal of the first stage-number switching control signal, wherein the first stage-number switching circuit includes:
a first switching transistor having a current channel connected between the output terminal of the first charge pump circuit group and the input terminal of the second charge pump circuit group; and
a first capacitor, one electrode of which is supplied with a clock signal synchronized with a clock signal input to the charge pump circuit, and the other electrode of which is connected to a gate of the first switching transistor, in a case where the first stage-number switching control signal is at a first voltage level, the first switching transistor is turned on with a supplied clock signal, and in a case where the first stage-number switching control signal is at a second voltage level, the first switching transistor is turned off, wherein the second stage-number switching circuit includes:
a second switching transistor having a current channel connected between the output terminal of the first charge pump circuit group and the input terminal of the third charge pump circuit group; and
a second capacitor, one electrode of which is supplied with a clock signal synchronized with a clock signal input to the charge pump circuit, and the other electrode of which is connected to a gate of the second switching transistor, in a case where the second stage-number switching control signal is at the first voltage level, the second switching transistor is turned on with a supplied clock signal, and in a case where the second stage-number switching control signal is at the second voltage level, the second switching transistor is turned off.

36. A non-volatile semiconductor storage device, comprising:
a boosting circuit;
a non-volatile memory cell array that is supplied with a boosting voltage from the boosting circuit; and
a stage-number switching control circuit for switching a voltage level of a stage-number switching control signal to a first or second voltage level, in accordance with an operation mode of a memory,
wherein the boosting circuit has charge pump circuits for generating a boosting voltage with respect to a predetermined potential by allowing charge to move through a charge transfer transistor in synchronization with a clock signal input through a capacitor, the boosting circuit comprising:
a first charge pump circuit group in which the charge pump circuits are connected in series of n stages (n is an integer of 2 or more) to each other;
a second charge pump circuit group in which the charge pump circuits are connected in series of m stages (m is an integer of 2 or more) to each other; and
a stage-number switching circuit for switching an output terminal of the first charge pump circuit group and an input terminal of the second charge pump circuit group between a connected state and an unconnected state in accordance with a stage-number switching control signal, in such a manner that the first charge pump circuit group and the second charge pump circuit group are connected in series with each other and the second charge pump circuit group outputs a first boosting voltage, or the first charge pump circuit group and the second charge pump circuit group are connected in parallel with each other and the first and second charge pump circuit groups output a second boosting voltage, wherein the stage-number switching circuit includes:
- a level shift circuit that is supplied with the first or second boosting voltage as a supply voltage to shift a voltage level of the stage-number switching control signal; and
- a switch circuit for switching an output terminal of the first charge pump circuit group and an input terminal of the second charge pump circuit group between a connected state and an unconnected state, in accordance with a signal output from the level shift circuit.

* * * * *